(12) United States Patent
Imayama

(10) Patent No.: US 8,362,822 B2
(45) Date of Patent: Jan. 29, 2013

(54) SEMICONDUCTOR DEVICE HAVING A BIAS RESISTOR CIRCUIT

(75) Inventor: Teruo Imayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 13/045,699

(22) Filed: Mar. 11, 2011

(65) Prior Publication Data

US 2011/0298533 A1 Dec. 8, 2011

(30) Foreign Application Priority Data

Jun. 3, 2010 (JP) .................................. 2010-127395

(51) Int. Cl.
*G11C 5/14* (2006.01)
(52) U.S. Cl. ......... 327/530; 327/538; 327/540; 327/543
(58) Field of Classification Search .................. 327/530, 327/538–543, 546; 323/312–317
See application file for complete search history.

(56) References Cited

U.S. PATENT DOCUMENTS

| | | | | |
|---|---|---|---|---|
| 4,686,487 A | * | 8/1987 | Radovsky | 330/288 |
| RE35,261 E | * | 6/1996 | Nelson | 330/257 |
| 5,701,098 A | * | 12/1997 | Yeung | 327/538 |
| 5,917,368 A | * | 6/1999 | Tan et al. | 327/543 |
| 6,172,556 B1 | * | 1/2001 | Prentice | 327/543 |
| 6,255,897 B1 | * | 7/2001 | Klemmer | 327/538 |
| 7,030,677 B2 | * | 4/2006 | Pannwitz | 327/314 |
| 7,667,272 B2 | * | 2/2010 | Hirose | 257/360 |

FOREIGN PATENT DOCUMENTS

| | | |
|---|---|---|
| JP | 2005-204297 | 7/2005 |
| JP | 2006-245740 | 9/2006 |

* cited by examiner

*Primary Examiner* — Lincoln Donovan
*Assistant Examiner* — Brandon S Cole
(74) *Attorney, Agent, or Firm* — Turocy & Watson, LLP

(57) ABSTRACT

According to one embodiment, a semiconductor device provided with an input terminal and a resistor circuit is presented. The resistor circuit is provided with first and second transistors, a first resistor, a capacitor and a capacitor. A drain of the first transistor is connected to the input terminal. One end of the first resistor is connected to a gate of the first transistor. A drain of the second transistor is connected to a source of the first transistor. A gate of the second transistor is connected to the other end of the first resistor. A source of the second transistor is connected to a power supply of a source side. The capacitor is connected between the drain and the gate of the first transistor. The voltage supply circuit is connected to the other end of the first resistor and the gate of the second transistor.

20 Claims, 4 Drawing Sheets

SEMICONDUCTOR DEVICE HAVING A BIAS RESISTOR CIRCUIT

CROSS-REFERENCE TO RELATED APPLICATION(S)

This application is based upon and claims the benefit of priority from the prior Japanese Patent Application No. 2010-127395, filed on Jun. 3, 2010, the entire contents of which are incorporated herein by reference.

FIELD

Embodiments described herein relate generally to a semiconductor device having a bias resistor circuit.

BACKGROUND

An electret condenser microphone (hereinafter referred to as "ECM") is widely used in a mobile telephone, a digital recorder such as an IC recorder, a personal computer, etc. The ECM has a low output frequency and extremely high output impedance. Accordingly, a signal to be inputted to an amplification circuit connected to the ECM is biased by a high resistance of a resistor.

A bias resistor of high resistance is formed in a semiconductor device so as to match manufacturing steps of a MOSFET to be formed in the semiconductor device. For example, a resistor circuit using a drain-source resistance of a MOSFET is often used as the bias resistor of high resistance. In this case, the gate voltage of the MOSFET is a voltage in a range lower than the threshold voltage.

The bias voltage generated by the resistor circuit changes, when a signal having a large signal amplitude is inputted into the bias resistor circuit which is connected to an input end of an amplification circuit. This change of the bias voltage causes change of the bias resistance value, which deteriorates the distortion characteristic of the amplification circuit and may increase a total harmonic distortion.

DETAILED DESCRIPTION

Figure 1:
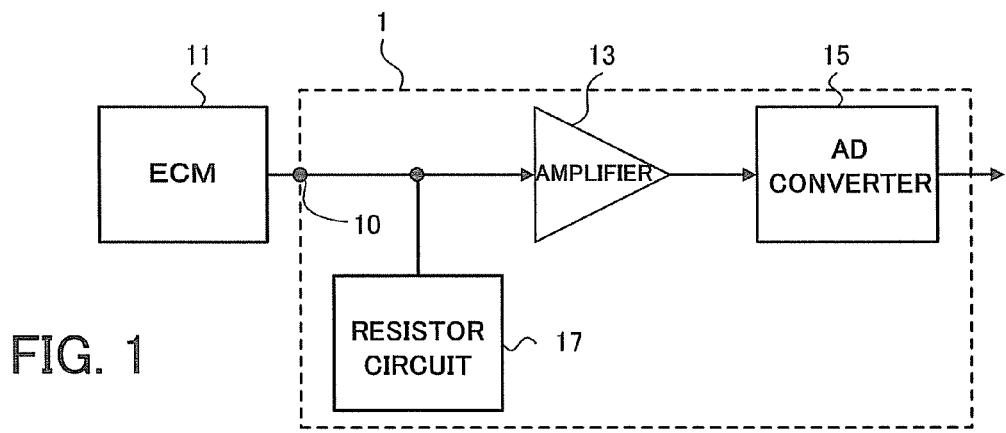
FIG. 1 is a block diagram schematically illustrating a configuration of the semiconductor device according to a first embodiment.

According to one embodiment, a semiconductor device provided with an input terminal and a resistor circuit is presented. The resistor circuit is provided with first and second transistors, a first resistor, a capacitor and a capacitor. A drain of the first transistor is connected to the input terminal. One end of the first resistor is connected to a gate of the first transistor. A drain of the second transistor is connected to a source of the first transistor. A gate of the second transistor is connected to the other end of the first resistor. A source of the second transistor is connected to a power supply of a source side. The capacitor is connected between the drain and the gate of the first transistor. The voltage supply circuit is connected to the other end of the first resistor and the gate of the second transistor.

According to another embodiment, a semiconductor device provided with an input terminal and a resistor circuit is presented. The resistor circuit is provided with first and second transistors, a first resistor, a first capacitor and a voltage supply circuit. One end of the first resistor is connected to a gate of the first transistor. A drain of the second transistor is connected to a source of the first transistor. A gate of the second transistor is connected to the other end of the first resistor. A source of the second transistor is connected to a power supply of a source side. The capacitor is connected between the drain and the gate of the first transistor. The voltage supply circuit is connected to the other end of the first resistor and the gate of the second transistor.

Hereinafter, further embodiments will be described with reference to the drawings. In the drawings, the same reference numerals denote the same or similar portions respectively.

A first embodiment will be described with reference to FIGS. 1 to 5. FIG. 1 is a block diagram schematically illustrating a configuration of a semiconductor device according to a first embodiment.

As illustrated in FIG. 1, an input terminal 10 of a semiconductor device 1 is connected to an external ECM (Electret Condenser Microphone) 11. The semiconductor device 1 is a monolithic IC. The semiconductor device 1 is provided with an amplification circuit 13, an AD converter 15 called ΔΣADC (Analog-Digital Converter), and a bias resistor circuit 17.

An audio signal, i.e., an analog signal, is converted by the ECM 11 into an electric signal. The electric signal is inputted into the amplification circuit 13 having an impedance conversion function and is amplified by the amplification circuit 13. The amplified electric signal is converted into a digital signal by the AD converter 15. The digital signal is outputted from the AD converter 15. The electric signal from the ECM 11 is biased by the resistor circuit 17, and is inputted into the amplification circuit 13.

The ECM 11 is formed on a substrate or a package which is independent from the semiconductor device 1. Alternatively, the ECM 11 may be mounted or formed on the same substrate where the semiconductor device 1 is formed.

Figure 2:
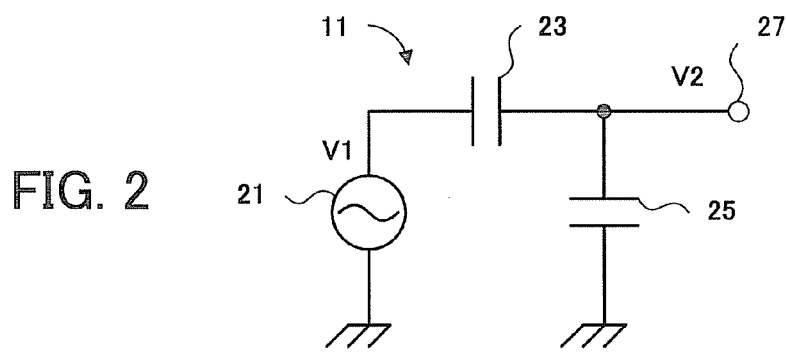
FIG. 2 is an equivalent circuit diagram illustrating an ECM connected to the semiconductor device.

FIG. 2 is an equivalent circuit diagram illustrating the ECM 11. In FIG. 2, a voltage signal source 21 is an external audio signal source which converts voice or sound into an electric signal. A voltage signal V1 is a voltage of the electric signal obtained by the conversion. Capacitors 23, 25 are equivalent capacitances of an interior of the ECM 11. One end of the capacitor 23 is connected to one end of the voltage signal source 21. The other end of the capacitor 23 is connected to one end of the capacitor 25 and an output terminal 27. The other end of the voltage signal source 21 and the other end of the capacitor 25 are grounded.

Figure 3:
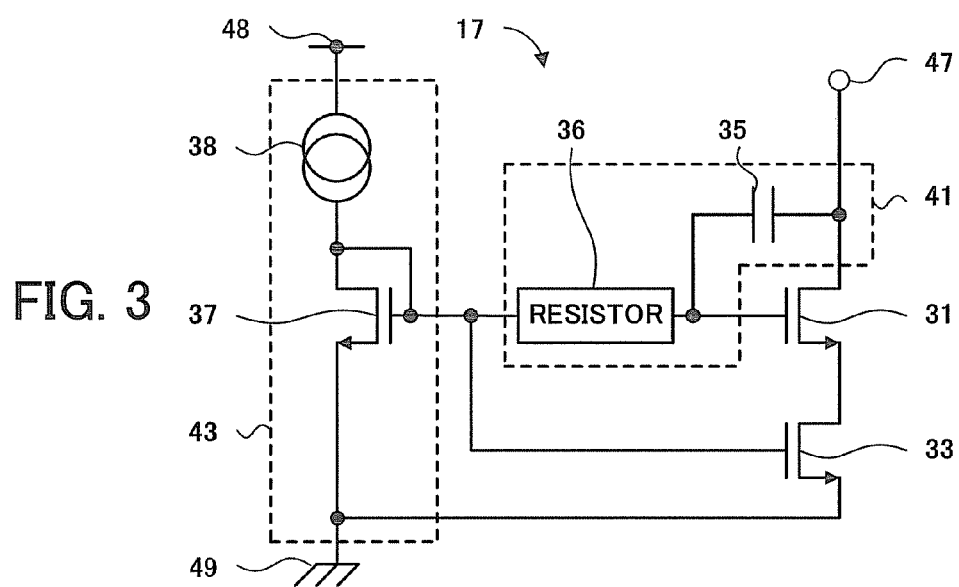
FIG. 3 is a diagram schematically illustrating a resistor circuit of the semiconductor device.

FIG. 3 illustrates a configuration of the resistor circuit 17 more specifically. The resistor circuit 17 is provided with a voltage supply circuit 43, a high pass filter 41, and first and second transistors 31, 33 serving as cascade-connected resistors. The high pass filter 41 is provided with a capacitor 35 and a resistor 36. The capacitor 35 is connected between the gate and the drain of the transistor 31, i.e., the first transistor. One end of the resistor 36 is connected to the gate of the transistor 31. The drain of the transistor 33, i.e., the second transistor, is connected to the source of the transistor 31. The gate of the transistor 33 is connected to the other end of the resistor 36. The source of the transistor 33 is connected to a ground 49, i.e., a power supply of a source side. The drain of the transistor 31 is connected to a terminal 47. The terminal 47 is connected to an output terminal 27 of the ECM 11 shown in FIG. 2.

The voltage supply circuit 43 is provided with a current source 38 and a transistor 37 having a gate and a drain connected with each other. The transistor 37 serves as a third transistor. One end of the current source 38 is connected to a power supply 48, i.e., a power supply of a drain side. The other end of the current source 38 is connected to the drain and the gate of the transistor 37. The gate of the transistor 37 is connected to the gate of the transistor 33 and the other end of the resistor 36. The source of the transistor 37 is connected to the ground 49.

For example, each of the transistors 31, 33, 37 is an N-channel MOSFET (Metal Oxide Semiconductor Field Effect Transistor). The capacitor 35 may be constituted by an MIM (Metal-Insulator-Metal) capacitor. Alternatively, an MOS capacitor may be used. The resistor 36 may be constituted by a MOSFET having a drain-source resistance.

The resistance value of the resistor circuit 17 is a resistance value obtained by adding the drain-source resistance value of the transistor 31 and the drain-source resistance value of the transistor 33. The drain-source resistances of the transistors 31, 33 are determined by a gate potential of the transistor 37. When the gate potential of the transistor 37 is high, the drain-source resistances of the transistors 31, 33 are small. When the gate potential of the transistor 37 is low, the drain-source resistances of the transistors 31, 33 are large. Since the gate potential of the transistor 37 is determined by a current value of the current source 38, the resistor circuit 17 may be used as a variable resistor circuit by changing the current value of the current source 38. Well-known techniques may be used to make a circuit constituting the current source 38 and to change the current value of the circuit. For example, the current source 38 may be composed of a current source which provides a current proportional to a VT (thermal voltage).

Operation of the semiconductor device 1 will be explained below. In FIG. 2, an audio signal is converted into a voltage signal V1 in the voltage signal source 21 of the EMC 11. The obtained voltage signal V1 is changed to a voltage signal V2 via the capacitor 23, and the voltage signal V2 is outputted to the output terminal 27. The output terminal 27 is connected to the terminal 47 of the resistor circuit 17 illustrated in FIG. 3 via the input terminal 10 of the semiconductor device 1. The voltage signal V2 which is inputted into the amplification circuit 13 from the ECM 11 of FIG. 1 is assumed to be 0 V initially. The voltage signal V2 is assumed to shift to a positive side.

The gate-source voltage of the transistor 31 is expressed by "Vgs1". The gate-source voltage of the transistor 33 is expressed by "Vgs2". The drain-source resistance of the transistor 31 is expressed by "Rds1". The drain-source resistance of the transistor 33 is expressed by "Rds2".

The voltage supply circuit 43 applies a fixed bias voltage to the gate of the transistor 33 constantly. Accordingly, the gate-source voltage Vgs2 of the transistor 33 does not change, and the drain-source resistance Rds2 of the transistor 33 remains constant. The gate potential of the transistor 33 is maintained at a voltage lower than the threshold voltage of the transistor 33 so that the transistor 33 indicates high impedance.

The drain of the transistor 31 is connected to the terminal 47. Accordingly, when the voltage signal V2 shifts to a positive side, the drain of the transistor 31 also shifts to a positive side. The capacitor 35 is connected between the drain and the gate of the transistor 31. Thus, similarly to the shift of the drain potential of the transistor 31, the gate potential of the transistor 31 also shifts to a positive side. As a result, the gate-source voltage Vgs1 of the transistor 31 increases, and the drain-source resistance Rds1 of the transistor 31 decreases. The gate potential of the transistor 31 is given so as to maintain a voltage lower than a threshold voltage so that the transistor 31 indicates high impedance. The high pass filter 41 filters the voltage signal V2 so as to cut off a frequency equal to or less than about 1 Hz, for example. The high pass filter 41 is inserted so as to change the voltages of the drain and the source of the transistors 31. A frequency of approximately 1 Hz or less is cut off in the voltage signal V2, for example.

The voltage signal V2 is assumed to shift to a negative side subsequently. The voltage supply circuit 43 applies a fixed bias voltage to the gate of the transistor 33 constantly. Accordingly, the gate-source voltage Vgs2 of the transistor 33 does not change, and the drain-source resistance Rds2 of the transistor 33 remains constant.

On the other hand, the drain of the transistor 31 is connected to the terminal 47. Thus, when the voltage signal V2 shifts to a negative side, the drain of the transistor 31 also shifts to a negative side. Further, the capacitor 35 is connected between the drain and the gate of the transistor 31. Accordingly, similarly to the shift of the drain potential of the transistor 31, the gate of the transistor 31 also shifts to a negative side. As a result, the gate-source voltage Vgs1 of the transistor 31 decreases, and the drain-source resistance Rds1 increases.

When the voltage signal V2 shifts to a positive side, the drain-source resistance Rds1 of the transistor 31 decreases. When the voltage signal V2 shifts to a negative side, the drain-source resistance Rds2 of the transistor 31 increases. Further, the drain-source resistance Rds of the transistor 33 is constant regardless of the voltage signal V2.

It is assumed that the resistance ratio between the transistor 31 and the transistor 33 is 1:1, i.e., Rds1=Rds2. The total bias resistance value of the transistor 31, 33 is obtained by adding the drain-source resistance values Rds1, Rds2, and is expressed by "Rds1+Rds2". The ratio of the resistance value dependent upon the voltage signal V2 with respect to the total bias resistance value is one half of that of a case where the drain-source resistance value Rds2 of the transistor 33 does not exist. The resistance value dependent upon the voltage signal V2 is the drain-source resistance Rds1 of the transistor 31. The ratio is expressed by "Rds1/(Rds1+Rds2)".

As described above, when the voltage signal V2 shifts to a positive side or a negative side, the rate of the drain-source resistance Rds1 becomes small with respect to the total bias resistance value of the semiconductor device 1 of the embodiment. Accordingly, the linearity of the bias resistance value with respect to the voltage signal V2 is improved so that the distortion of the voltage signal V2 is improved.

Figure 4:
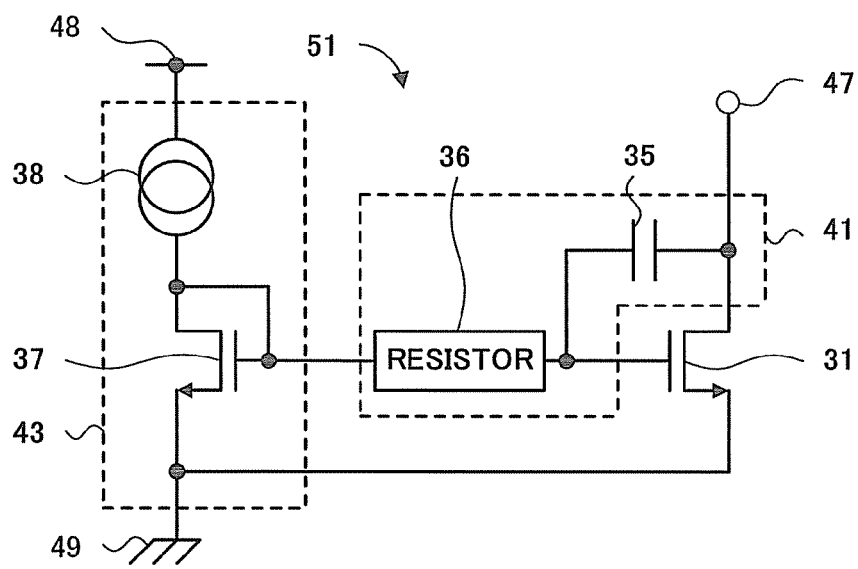
FIG. 4 is a diagram schematically illustrating a configuration of a comparative example of a resistor circuit.

FIG. 4 illustrates a resistor circuit of a semiconductor device according to a comparative example. The resistor circuit 51 has a circuit obtained by deleting the transistor 33 from the resistor circuit 17 of the first embodiment shown in FIG. 3. In the resistor circuit 51, the source of the transistor 31 is connected to the ground 49.

Figure 5:
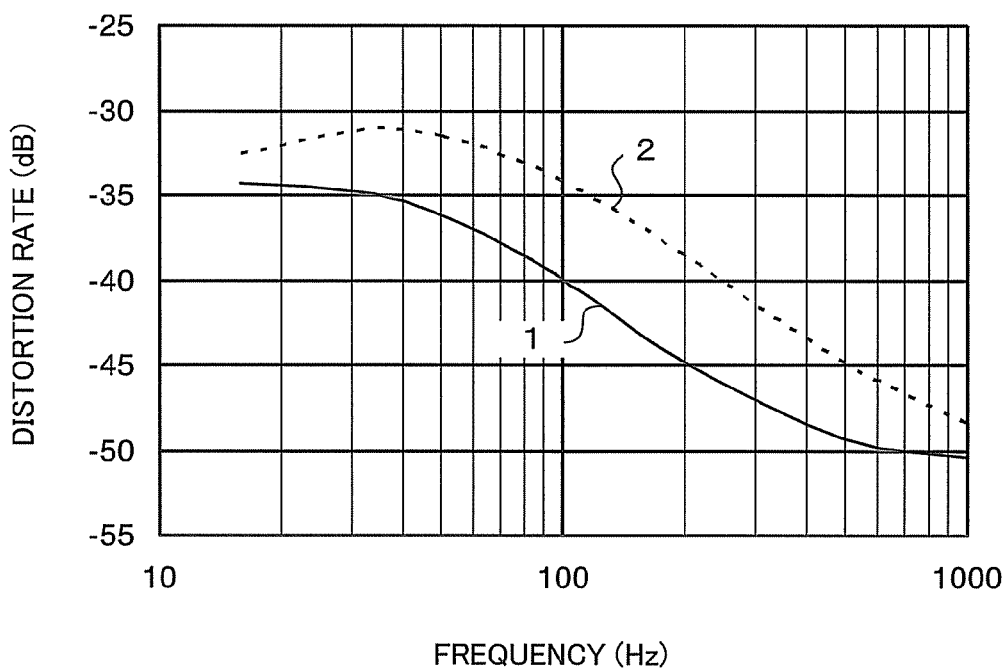
FIG. 5 is a figure illustrating a total harmonic distortion of the semiconductor device according to the first embodiment.

FIG. 5 illustrates a relationship between a total harmonic distortion and a frequency of the resistor circuits. The total harmonic distortion is a ratio of a sum of voltage signals of respective harmonics with respect to a voltage signal of a fundamental frequency. When the total harmonic distortion is large, a voltage signal having a poor linearity is formed.

In FIG. 5, the solid line 1 represents a property of the case of the first embodiment provided with the resistor circuit 17. The broken line 2 represents a property of the case of the comparative example provided with the resistor circuit 51. In the first embodiment, the total harmonic distortion is improved by more than 2 dB over the frequency range from 20 Hz to 1000 Hz, compared with the total harmonic distortion of the comparative example.

As described above, in the semiconductor device 1 of the embodiment, the gate and the drain of the transistor 31 are connected to the high pass filter 41. The transistor 31 is cascade-connected to the transistor 33 that is not connected to any high pass filter. This improves variation of the total bias resistance value of the resistor circuit 17, i.e., the resistance value obtained by adding the drain-source resistance values of the transistor 31, 33 so that the total harmonic distortion can be reduced. Since the semiconductor device 1 has the resistor circuit 17, the semiconductor device 1 can suppress deterioration of linearity. When the voltage signal V2 has large amplitude, variation of the bias resistance value can be significantly improved.

In the resistor circuit 17 according to the embodiment, the gate potential of the transistor 37 is determined by the current value of the current source 38. The gate potential of the transistor 37 determines the gate potentials of the transistors 31, 33. The total bias resistance value is given by the transistors 31, 33 which are connected in cascade with each other. The total bias resistance value can be changed by regulating current value of the current source 38. The resistor circuit 17 can also be used as a variable resistor.

A modification of the resistor circuit provided in the first embodiment will be explained with reference to FIG. 6. This modification is different from the resistor circuit of the first embodiment in that P-channel MOSFETs are provided as the transistors.

Figure 6:
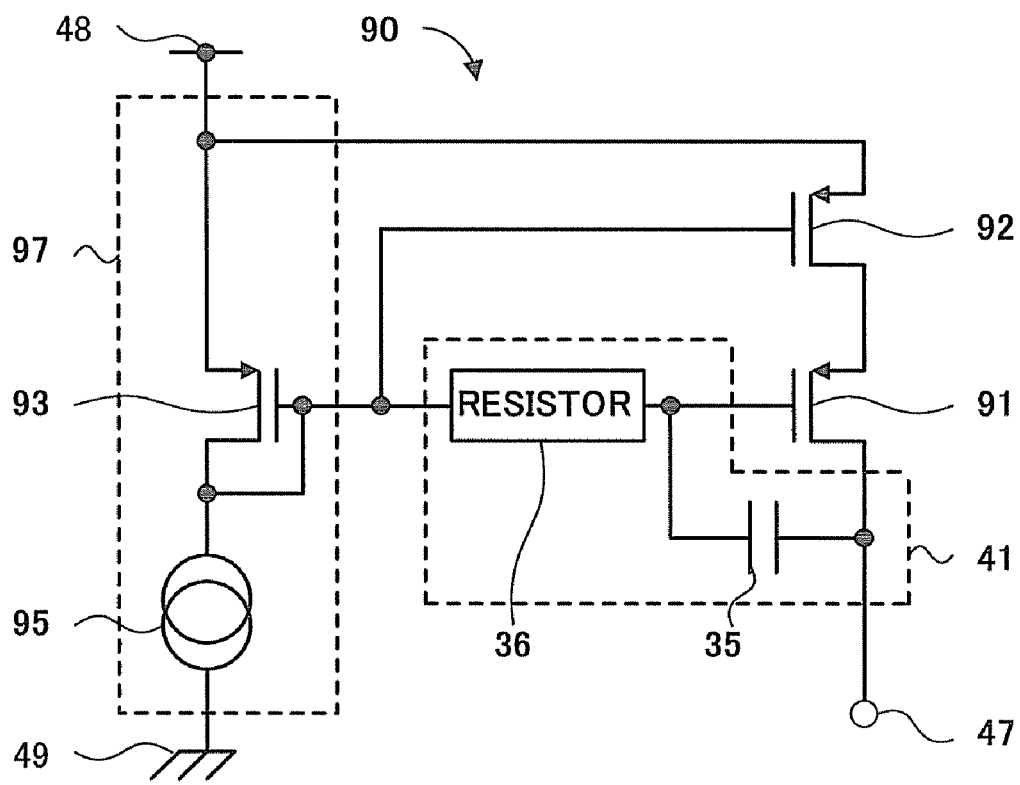
FIG. 6 is a figure schematically illustrating a modification of a resistor circuit.

In FIG. 6, a resistor circuit 90 is provided. The resistor circuit 90 has transistors 91, 92 serving as resistors, a high pass filter 41 and a voltage supply circuit 97. The transistors 91, 92 are cascade-connected. The high pass filter 41 is provided with a capacitor 35 and a resistor 36. The capacitor 35 is connected between the gate and the drain of the transistor 91. One end of the resistor 36 is connected to the gate of the transistor 91. The drain of the transistor 92 is connected to the source of the transistor 91. The gate of the transistor 92 is connected to the other end of the resistor 36. The source of the transistor 92 is connected to a power supply 48, i.e., a power supply of a source side.

The voltage supply circuit 97 is provided with a current source 95 and a transistor 93 having a gate and a drain connected with each other and serving as the third transistor. In the voltage supply circuit 97, one end of the current source 95 is connected to a ground 49, i.e., a power supply of a drain side. The other end of the current source 95 is connected to the drain and the gate of the transistor 93. The gate of the transistor 93 is connected to the gate of the transistor 92 and the other end of the resistor 36. The source of the transistor 93 is connected to the power supply 48. The drain of the transistor 91 is connected to a terminal 47 which is connected with the terminal 27 of the ECM 11 shown in FIG. 2.

The resistor circuit 90 of the modification can operate in the same manner as the resistor circuit 17 of the first embodiment. As a result, the semiconductor device of the modification having the resistor circuit 90 may indicate the same effects as the semiconductor device 1 according to the first embodiment as described above. The resistor circuit 90 is particularly effective, for example, when an input voltage around a power supply voltage is biased by circuits respectively shown in FIG. 8 or 9. These circuits will be described in detail below.

Figure 7:
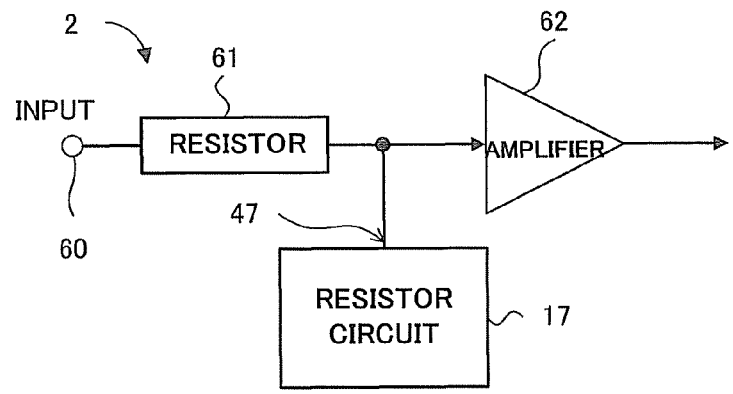
FIG. 7 is a block diagram schematically illustrating a configuration of a semiconductor device according to a second embodiment.

FIG. 7 shows a block diagram schematically illustrating a semiconductor device according to a second embodiment The second embodiment is different from the first embodiment in that a resistance bias voltage is applied to an analog signal other than the output signal provided from the EMC.

As illustrated in FIG. 7, in a semiconductor device 2, an input terminal 60 for receiving an input signal is connected to an amplification circuit 62 via a resistor 61. The terminal 47 of the resistor circuit 17 illustrated in FIG. 2 is connected between the resistor 61 and the amplification circuit 62.

When the resistor circuit 17 is used as a variable resistance device, the semiconductor device 2 may be an attenuator circuit capable of adjusting the amount of attenuation. The input signal may be an audio signal having high impedance. As described in the first embodiment, change of the resistances of the cascade-connected transistors 31, 33 provided in the resistor circuit 17 can be carried out by changing the current value of the current source 38 of the resistor circuit 17.

Similarly to the semiconductor device 1 of the first embodiment, the semiconductor device 2 can suppress deterioration of linearity. In addition, the semiconductor device 2 can attenuate the input signal when the resistance of the resistor circuit 17 is set at an appropriate value.

Figure 8:
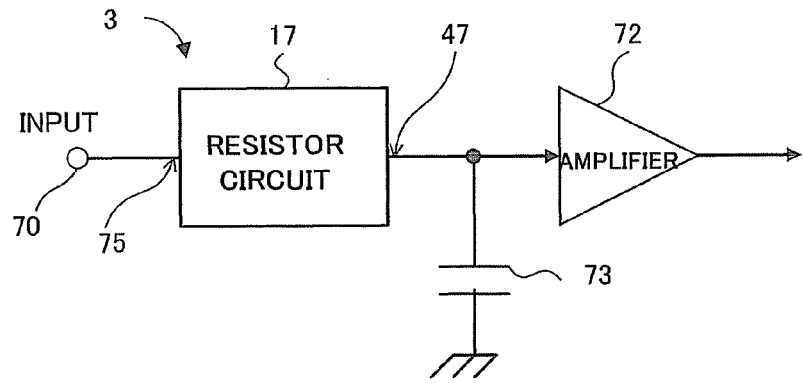
FIG. 8 is a block diagram schematically illustrating a configuration of a semiconductor device according to a third embodiment.

A semiconductor device according to a third embodiment will be explained with reference to FIGS. 8 and 3. As illustrated in FIG. 8, a semiconductor device 3 of the third embodiment is provided with an amplification circuit 72, a capacitor 73, and the resistor circuit 17 provided in the first embodiment and shown in FIG. 3. The third embodiment is different from the first embodiment in that the sources of the transistors 33, 37 of the resistor circuit 17 (a terminal 75 in FIG. 8) are connected to an input terminal 70 which receives an input signal. The drain of the transistor 31, i.e., the terminal 47, is an output end from which an output signal is transmitted.

In FIG. 8, the output signal transmitted from the terminal 47 is inputted into the amplification circuit 72, and at the same time, the output signal transmitted from the terminal 47 is grounded via the capacitor 73. A low pass filter is composed of the capacitor 73 and the cascade-connected transistors 31, 33 of the resistor circuit 17 illustrated in FIG. 3.

The semiconductor device 3 can adjust the cutoff frequency of the low pass filter when the resistance values of the transistors 31, 33 of the resistor circuit 17 are set at appropriate values. The semiconductor device 3 has a high degree of linearity.

Figure 9:
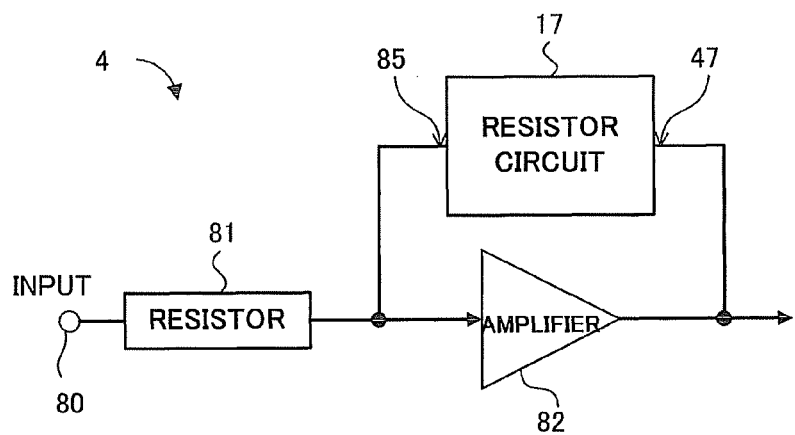
FIG. 9 is a block diagram schematically illustrating a configuration of a semiconductor device according to a fourth embodiment.

A semiconductor device according to the fourth embodiment will be explained with reference to FIGS. 9 and 3. As illustrated in FIG. 9, a semiconductor device 4 of the fourth embodiment is provided with an amplification circuit 82, a resistor 81, and the resistor circuit 17 shown in FIG. 3. One end of the resistor 81 is connected to an input terminal 80 so as to receive an input signal. The other end of the resistor 81 is connected to the input end of the amplification circuit 82. The sources of the transistors 33, 37 of the resistor circuit 17 (a terminal 85 in FIG. 9) are connected to the input end of the amplification circuit 82. The drain of the transistor 31, i.e., the terminal 47, is connected to the output end of the amplification circuit 82. The resistor circuit 17 constitutes a feedback circuit.

The semiconductor device 4 serves as a gain-adjustable feedback amplifier when resistance values of the cascade-connected transistors 31, 33 of the resistor circuit 17 are set at appropriate values. Further, the semiconductor device 4 can suppress deterioration of linearity of the output signal voltage of the semiconductor device 4 by adjusting the resistance values.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the embodiments described above, the first, second, and third transistors of the resistor circuits 17, 90 are composed of N-channel or P-channel MOSFETs. Alternatively, the first, second, and third transistors of the resistor circuits 17, 90 may be composed of bipolar transistors. In the second to fourth embodiments, the resistor circuit 17 shown in FIG. 3 is provided. Alternatively, the resistor circuit 90 shown in FIG. 6 may be used. In this case, in FIGS. 8 and 9 showing the third and fourth embodiments, the terminals 75, 85 need to be connected to the terminal 48 shown in FIG. 6, respectively.

In the third and fourth embodiments, the source of the transistor 37 illustrated in FIG. 3 may be grounded instead of being connected to the input terminals 70, 80 of FIGS. 8 and 9.

What is claimed is:

1. A semiconductor device which is provided with an input terminal and a resistor circuit, the resistor circuit comprising:
   a first transistor, a drain of the first transistor being connected to the input terminal;
   a first resistor, one end of the first resistor being connected to a gate of the first transistor;
   a second transistor, a drain of the second transistor being connected to a source of the first transistor, a gate of the second transistor being connected to the other end of the first resistor, a source of the second transistor being connected to a power supply of a source side;
   a capacitor connected between the drain and the gate of the first transistor; and
   a voltage supply circuit connected to the other end of the first resistor and the gate of the second transistor.

2. The semiconductor device according to claim 1, further comprising an amplification circuit, wherein an input end of the amplification circuit is connected to the input terminal.

3. The semiconductor device according to claim 2, further comprising an AD converter, wherein an input end of the AD converter is connected to an output end of the amplification circuit.

4. The semiconductor device according to claim 1, wherein the voltage supply circuit is provided with a constant current source and a third transistor, wherein a source of the third transistor is connected to the power supply of the source side, a drain of the third transistor is connected to a power supply of a drain side via the constant current source, and the drain and the gate of the third transistor are connected with each other.

5. The semiconductor device according to claim 4, wherein the output voltage of the voltage supply circuit can be changed when the current of the constant current source is changed.

6. The semiconductor device according to claim 4, wherein the first, second, and third transistors are N-channel MOSFETs, P-channel MOSFETs, or bipolar transistors.

7. The semiconductor device according to claim 2, further comprising a second resistor, wherein one end of the second resistor is connected to an input end of the amplification circuit and the drain of the first transistor of the resistor circuit, and the other end of the second resistor is connected to the input terminal.

8. The semiconductor device according to claim 1, wherein the input terminal can receive an analog signal.

9. The semiconductor device according to claim 8, wherein the analog signal is an output given by an electret condenser microphone.

10. The semiconductor device according to claim 1, wherein the first resistor and the capacitor constitute a high pass filter.

11. A semiconductor device which is provided with an input terminal and a resistor circuit, the resistor circuit comprising:
    a first transistor;
    a first resistor, one end of the first resistor being connected to a gate of the first transistor;
    a second transistor, a drain of the second transistor being connected to a source of the first transistor, a gate of the second transistor being connected to the other end of the first resistor, a source of the second transistor being connected to a power supply of a source side;
    a capacitor connected between the drain and the gate of the first transistor; and
    a voltage supply circuit connected to the other end of the first resistor and the gate of the second transistor.

12. The semiconductor device according to claim 11, further comprising an amplification circuit, wherein an input end of the amplification circuit is connected to the drain of the first transistor of the resistor circuit.

13. The semiconductor device according to claim 12, further comprising a second capacitor, wherein one end of the second capacitor is connected to the drain of the first transistor of the resistor circuit, and the other end of the second capacitor is connected to the power supply of the source side.

14. The semiconductor device according to claim 13, wherein the first resistor circuit and the second capacitor constitute a high pass filter.

15. The semiconductor device according to claim 11, further comprising an amplification circuit and a second resistor, wherein an end of the second resistor is connected to an input end of the amplification circuit, the other end of the second resistor is connected to the input terminal, the drain of the first transistor of the resistor circuit is connected to an output end of the amplification circuit, and the source of the second transistor of the resistor circuit is connected to the one end of the second resistor.

16. The semiconductor device according to claim 11, wherein the voltage supply circuit is provided with a constant current source and a third transistor, wherein a source of the third transistor is connected to the power supply of the source side, a drain of the third transistor is connected to a power supply of a drain side via the constant current source, and the drain and the gate of the third transistor are connected with each other.

17. The semiconductor device according to claim 16, wherein the output voltage of the voltage supply circuit can be changed when the current of the constant current source is changed.

18. The semiconductor device according to claim 16, wherein the first, second, and third transistors are N-channel MOSFETs, P-channel MOSFETs, or bipolar transistors.

19. The semiconductor device according to claim 11, wherein the input terminal can receive an analog signal.

20. The semiconductor device according to claim 19, wherein the analog signal is an output given by an electret condenser microphone.

* * * * *